United States Patent
Tsuji

(10) Patent No.: US 9,825,430 B2
(45) Date of Patent: Nov. 21, 2017

(54) METHOD FOR PRODUCING QUANTUM CASCADE LASER AND QUANTUM CASCADE LASER

(71) Applicant: SUMITOMO ELECTRIC INDUSTRIES, LTD., Osaka (JP)

(72) Inventor: Yukihiro Tsuji, Tama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/372,346

(22) Filed: Dec. 7, 2016

(65) Prior Publication Data

US 2017/0170634 A1 Jun. 15, 2017

(30) Foreign Application Priority Data

Dec. 10, 2015 (JP) .................................. 2015-241211

(51) Int. Cl.
*H01S 5/34* (2006.01)
*H01S 5/227* (2006.01)
*H01S 5/12* (2006.01)

(52) U.S. Cl.
CPC .............. *H01S 5/3402* (2013.01); *H01S 5/12* (2013.01); *H01S 5/2275* (2013.01)

(58) Field of Classification Search
CPC ......... H01S 5/3402; H01S 5/12; H01S 5/2275
See application file for complete search history.

(56) References Cited

U.S. PATENT DOCUMENTS

2015/0357794 A1* 12/2015 Tsuji ..................... H01S 5/3402
372/45.012
2017/0040769 A1* 2/2017 Hashimoto ........... H01S 5/0261

FOREIGN PATENT DOCUMENTS

JP 2008-216915 9/2008

* cited by examiner

*Primary Examiner* — Dung Nguyen
(74) *Attorney, Agent, or Firm* — Smith, Gambrell & Russell, LLP

(57) ABSTRACT

A method for producing a quantum cascade laser includes the steps of growing a stacked semiconductor layer including a core layer; forming an insulating mask on the stacked semiconductor layer; forming a mesa structure including the core layer by etching the stacked semiconductor layer through the insulating mask; growing a buried layer on a side surface of the mesa structure using the insulating mask by supplying a halogen-based substance and a gas containing a raw material, the buried layer having a thickness larger than a height of the mesa structure; producing a substrate product including the mesa structure and a buried region by processing of the buried layer using a chemical-mechanical polishing method; and after removal of the insulating mask, producing a distributed reflection structure by etching the mesa structure and the buried region of the substrate product using a mask.

5 Claims, 13 Drawing Sheets

METHOD FOR PRODUCING QUANTUM CASCADE LASER AND QUANTUM CASCADE LASER

BACKGROUND OF THE INVENTION

1. Field of the Invention

The present invention relates to a method for producing a quantum cascade laser and a quantum cascade laser.

2. Description of the Related Art

Japanese Unexamined Patent Application Publication No. 2008-218915 discloses a quantum cascade laser.

SUMMARY OF THE INVENTION

As reflection structures of quantum cascade lasers that emit mid-infrared light, distributed reflection (DR) structures may be used in place of dielectric reflector films. The oscillation wavelength of a quantum cascade laser, however, is longer than the oscillation wavelength of what is called a communication semiconductor laser that emits light having a wavelength of 1.3 μm to 1.55 μm. As a result, a beam width of light emitted from the quantum cascade laser is wider than a beam width of light from the communication semiconductor laser. To receive and reflect broadened light, the quantum cascade laser requires a DR structure having a greater width than the waveguide mesa. The thickness of a semiconductor region (buried layer) that embeds a side surface of the mesa decreases with increasing distance from the mesa on a wafer because of crystal growth to form the buried layer (growth of the buried layer). Variations in the thickness of the semiconductor region affect the resolution of resist exposure in pattern formation used to form a DR structure after the growth of the buried layer. There have been demands for a method of reducing the effect of the thickness and for providing a DR structure having good uniformity in thickness.

A method for producing a quantum cascade laser according to an aspect of the present invention includes the steps of growing a stacked semiconductor layer on a principal surface of a substrate, the stacked semiconductor layer including a core layer; forming an insulating mask on the stacked semiconductor layer; forming a mesa structure including the core layer on the principal surface of the substrate by etching the stacked semiconductor layer through the insulating mask; growing a buried layer on a side surface of the mesa structure using the insulating mask as a selective mask by supplying a halogen-based substance and a gas containing a raw material into a growth chamber, the buried layer having a thickness larger than a height of the mesa structure; producing a substrate product including the mesa structure and a buried region by processing of the buried layer using a chemical-mechanical polishing method; after removal of the insulating mask, forming a mask on the mesa structure and the buried region of the substrate product; and producing a distributed reflection structure by etching the mesa structure and the buried region of the substrate product using the mask.

A quantum cascade laser according to another aspect of the present invention includes a substrate having a principal surface including a first area, a second area, and a third area, the first area being disposed between the second area and the third area; a waveguide structure provided on the first area of the substrate, the waveguide structure including a core layer, the waveguide structure extending in a direction of a first axis; a buried region provided on the second area and the third area of the substrate, the waveguide structure being embedded by the buried region; and a distributed reflection structure optically coupled to an end facet of the waveguide structure, the distributed reflection structure having a larger width than the waveguide structure, the distributed reflection structure including one or more semiconductor walls extending in a direction of a second axis that intersects the first axis. Each of the semiconductor walls includes a first portion provided on the first area, a second portion provided on the second area, and a third portion provided on the third area. The second portion, the first portion, and the third portion are arranged in that order in the direction of the second axis. In addition, each of the second portion and the third portion has an upper surface higher than an upper surface of the first portion.

The foregoing objects, another object, features, and advantages of the present invention would be readily apparent by detailed description of preferred embodiments of the present invention with reference to the attached drawings.

DESCRIPTION OF THE PREFERRED EMBODIMENTS

Figure 1A:
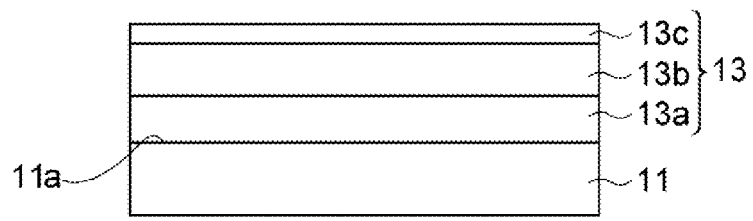
FIGS. 1A to 1C schematically illustrate main steps in a method for producing a quantum cascade laser according to an embodiment.

Several embodiments will be described below.

A method for producing a quantum cascade laser according to an embodiment includes the steps of (a) growing a stacked semiconductor layer on a principal surface of a substrate, the stacked semiconductor layer including a core layer; (b) forming an insulating mask on the stacked semiconductor layer; (c) forming a mesa structure including the core layer on the principal surface of the substrate by etching the stacked semiconductor layer through the insulating mask; (d) growing a buried layer on a side surface of the mesa structure using the insulating mask as a selective mask by supplying a halogen-based substance and a gas containing a raw material into a growth chamber, the buried layer having a thickness larger than a height of the mesa structure; (e) producing a substrate product including the mesa structure and a buried region by processing of the buried layer using a chemical-mechanical polishing method; (f) after removal of the insulating mask, forming a mask on the mesa structure and the buried region of the substrate product; and (g) producing a distributed reflection structure by etching the mesa structure and the buried region of the substrate product using the mask.

In the method for producing a quantum cascade laser, the buried layer is grown on the side surface of the mesa structure to embed the mesa structure. The buried layer has a thickness larger than a height of the mesa structure. The buried layer is processed by a chemical-mechanical polishing method. The processing of the buried layer results in the formation of the buried region where the mesa structure is embedded. In the processing of the buried layer, the buried layer is thinned by the polishing. After the processing, the mask for the formation of the distributed reflection structure is formed on the buried region and the mesa structure. This reduces a difference in resolution between a surface of the buried region and a surface of the mesa structure at the time of exposure for the formation of the mask. Thus, the distributed reflection structure is wider than the width of the mesa structure, extends from one buried portion arranged on one side of the mesa structure to the other buried portion arranged on the other side of the mesa structure, and intersects the mesa structure.

In the method for producing a quantum cascade laser according to an embodiment, preferably, in the step of producing the substrate product, the processing of the buried layer includes a step of detecting an endpoint of the processing using the insulating mask.

According to the method for producing a quantum cascade laser, the endpoint of the processing may be detected in association with the height of the mesa structure.

In the method for producing a quantum cascade laser according to an embodiment, the buried layer may be made of InP. The buried layer may have a (100) plane that is exposed at an upper surface of the buried layer.

According to the method for producing a quantum cascade laser, a high-flatness surface serving as an underlying surface used for subsequent processing may be provided.

In the method for producing a quantum cascade laser according to an embodiment, preferably, the mesa structure has an upper layer extending along a first reference plane. The buried layer includes a side surface extending along a second reference plane inclined with respect to the first reference plane. In addition, the side surface of the buried layer includes a (111)B plane.

According to the method for producing a quantum cascade laser, the growth such that the (111)B plane is exposed at the side surface of the buried layer may facilitate providing the flat upper surface of the buried layer.

In the method for producing a quantum cascade laser according to an embodiment, preferably, in the step of producing the substrate product, the processing of the buried layer is performed by using a polishing liquid that contains a Br/methanol mixture.

According to the method for producing a quantum cascade laser, the speed of the processing may be controlled by adjusting the mixing ratio in the Br/methanol mixture.

A quantum cascade laser according to an embodiment includes (a) a substrate having a principal surface including a first area, a second area, and a third area, the first area being disposed between the second area and the third area; (b) a waveguide structure provided on the first area of the substrate, the waveguide structure including a core layer, the waveguide structure extending in a direction of a first axis; (c) a buried region provided on the second area and the third area of the substrate, the waveguide structure being embedded by the buried region; and (d) a distributed reflection structure optically coupled to an end facet of the waveguide structure, the distributed reflection structure having a larger width than the waveguide structure, the distributed reflection structure including one or more semiconductor walls extending in a direction of a second axis that intersects the first axis. Each of the semiconductor walls includes a first portion provided on the first area, a second portion provided on the second area, and a third portion provided on the third area. The second portion, the first portion, and the third portion are arranged in that order in the direction of the second axis. Each of the second portion and the third portion has an upper surface higher than an upper surface of the first portion.

In the quantum cascade laser, light propagating through the waveguide structure is emitted from an end facet of the waveguide structure and diverges horizontally and vertically. The distributed reflection structure includes one or more semiconductor walls. In each of the semiconductor walls, the upper surface of the second portion and the upper surface of the third portion are higher than the upper surface of the first portion. Owing to the distributed reflection structure in which the height of the second and third portions of each of the semiconductor walls is greater than the height of the first portion of the corresponding semiconductor wall, the distributed reflection structure including the semiconductor walls each having uniform thickness is produced.

DETAILED DESCRIPTION OF EMBODIMENTS

Findings of the present invention can be readily appreciated in view of the following detailed description with reference to the attached illustrative drawings. A method for producing a quantum cascade laser and embodiments of a quantum cascade laser will be described below with reference to the attached drawings. The same elements are designated using the same reference numerals, if possible.

FIGS. 1A to 5C schematically illustrate main steps in a method for producing a quantum cascade laser according to an embodiment. A substrate (for example, a substrate 11 illustrated in FIG. 1A) for crystal growth is prepared. The substrate includes, for example, a semiconductor wafer and, specifically, is composed of a III-V group compound semiconductor, such as InP. As illustrated in FIG. 1A, a stacked semiconductor layer 13 including a plurality of semiconductor layers is grown on a principal surface 11a of the substrate 11. This crystal growth is performed by, for example, a metal-organic vapor phase epitaxy (MOVPE) method and/or a molecular beam epitaxial (MBE) growth method. The stacked semiconductor layer 13 includes, for example, a semiconductor layer 13a to be formed into a core layer (active layer) and a semiconductor layer 13b to be formed into an upper cladding layer. The stacked semiconductor layer 13 may include a semiconductor layer 13c to be formed into a contact layer or capping layer, if necessary. The stacked semiconductor layer 13 may further include a semiconductor layer to be formed into a lower cladding layer or a buffer layer, as needed.

Example of substrate 11: InP wafer

Plane direction of principal surface 11a of substrate: (100) plane, off-angle range: −0.3° to +0.3°

Figure 1B:
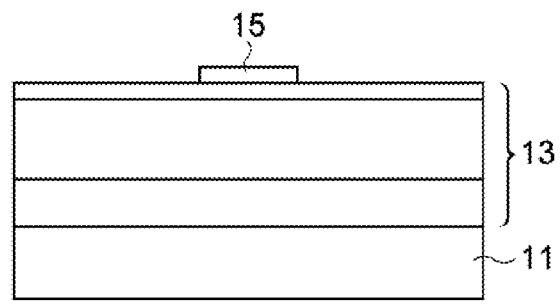

Example of stacked semiconductor layer 13
Semiconductor layer 13a to be formed into core layer (active layer): quantum well InGaAs/AlInAs, thickness: 3 μm
Semiconductor layer 13b to be formed into upper cladding layer: n-type InP, thickness: 3 μm
Semiconductor layer 13c to be formed into contact layer or capping layer: n-type GaInAs, thickness: 100 nm
Semiconductor layer to be formed into lower cladding layer or buffer layer: n-type InP As illustrated in FIG. 1B, an insulating mask 15 is formed on the stacked semiconductor layer 13. The insulating mask 15 includes a pattern that defines the form of a waveguide mesa including the core layer (active layer). In this embodiment, the pattern of the insulating mask 15 has a stripe shape that intersects one side and the other side (opposite the one side) of a single device section. The insulating mask 15 is composed of, for example, a silicon-based inorganic insulating material. The silicon-based inorganic insulating material contains, for example, a silicon nitride such as SiN, a silicon oxide such as $SiO_2$, or a silicon oxide nitride such as SiON. SiN used in this embodiment is deposited by, for example, a chemical vapor deposition (CVD) method. The insulating mask 15 has a thickness of about 100 to about 1000 nm.

Figure 1C:
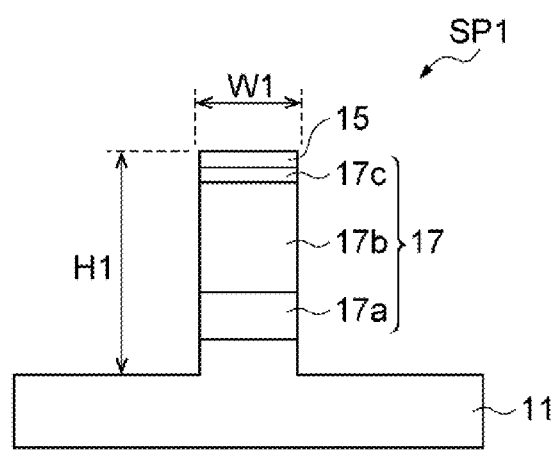

As illustrated in FIG. 1C, the stacked semiconductor layer 13 is etched through the insulating mask 15. A surface layer of the stacked semiconductor layer 13 and a surface of the substrate 11 are processed by this etching to form a stripe-shaped mesa structure 17. The mesa structure 17 extends on the principal surface 11a of the substrate 11. The mesa structure 17 has a mesa height H1 of about 5 to about 10 μm. The mesa structure 17 has a mesa width W1 of about 5 to about 10 μm. The mesa structure 17 includes a core layer (active layer) 17a, an upper cladding layer 17b, and a contact layer 17c. The etching is performed by a dry etching method with a halogen-based etchant, for example, chlorine, hydrogen chloride, boron trichloride, silicon tetrachloride, hydrogen bromide, or hydrogen iodide. The insulating mask 15 is left without being removed even after the etching. In the etching step, a first substrate product SP1 including the mesa structure 17 is formed. A substrate surface of the first substrate product SP1 and a side surface of the mesa structure 17 are exposed. An upper surface of the mesa structure 17 is covered with the insulating mask 15.

Figure 2A:
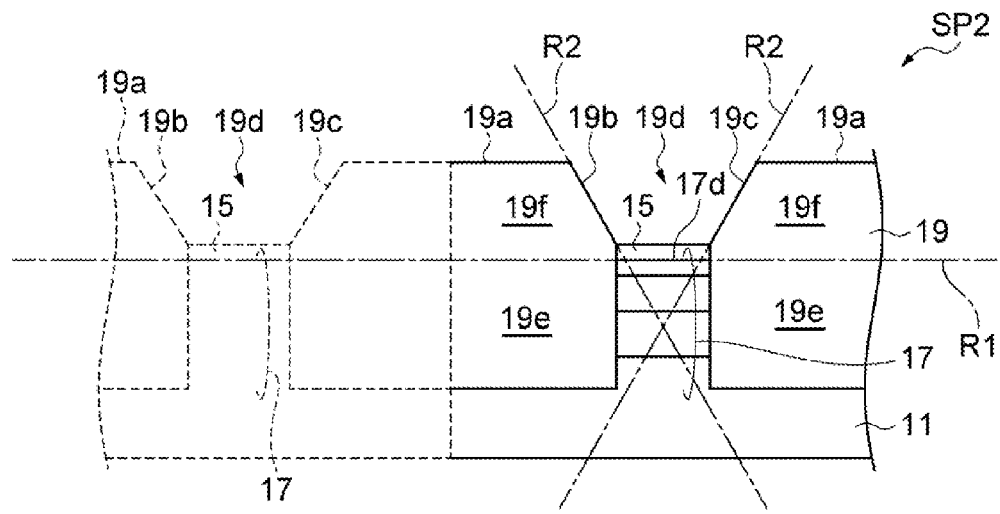
FIGS. 2A and 2B schematically illustrate main steps in a method for producing a quantum cascade laser according to an embodiment.

After the etching, a semiconductor is selectively grown on the side surface of the mesa structure and the surface of the first substrate product SP1 by using the insulating mask 15 as a selective growth mask to form a buried layer 19, as illustrated in FIG. 2A. Specifically, the semiconductor is not grown on the insulating mask 15 but selectively grown on a surface of the semiconductor layer that is not covered with the insulating mask 15. A gas containing a halogen-based substance is supplied into a growth chamber during the selective growth in addition to raw materials for the growth of the semiconductor. Examples of the halogen-based substance include hydrogen chloride (hydrochloric acid) and carbon tetrabromide. The halogen-based gas supplied together with the raw-material gases has the effect of reducing a growth rate on the (011) plane exposed at side surfaces of the mesa, compared with a growth rate on the surface of the substrate at which the (100) plane is exposed. The ratio of the growth rate on the (011) plane of the side surfaces of the mesa to the growth rate on the (100) plane of the surface of the wafer is set to 1:2 by adjusting the flow rate of the halogen-based gas. This inhibits the formation of step height and so forth due to the anomalous growth of the semiconductor for the buried layer around the mesa structure 17 and on the insulating mask 15. In this growth process, the buried layer is grown on the substrate surface of the first substrate product SP1 and the side surfaces of the mesa structure 17 to embed the mesa structure 17. Meanwhile, no crystal growth of the semiconductor for the buried layer occurs on the upper surface of the mesa structure 17 covered with the insulating mask 15.

Example of growth conditions
Buried layer 19: semi-insulating iron-doped InP
Growth temperature of buried layer 19: 550° C. to 600° C.
Type of halogen: hydrogen chloride (HCl)
Flow rate of gas containing halogen-based substance: 1 to 10 $cm^3$/min (converted value in an environment with a temperature of 0° C. and a pressure of 1013 hPa)
Flow rate of phosphorus raw material (for example, phosphine ($PH_3$)): 10 to 100 $cm^3$/min (converted value in an environment with a temperature of 0° C. and a pressure of 1013 hPa)
Flow rate of indium raw material (for example, trimethyl indium): 1 to 10 $cm^3$ (converted value in an environment with a temperature of 0° C. and a pressure of 1013 hPa)

The growth temperature may be monitored as a temperature of a substrate mounting stage of the growth chamber.

The buried layers 19 in this embodiment are grown so as to be thick and so as to be larger than the height of the mesa structure 17. That is, the buried layers 19 are formed so as to have a thickness that is larger than the height of the mesa structure 17. For the sake of easy understanding of the embodiment, FIG. 2A illustrates a single-device section on the substrate 11 for the growth. Another device section adjacent to the device section is illustrated by dashed lines. The wafer used for the substrate 11 includes the array of one or more mesa structures substantially equivalent to the single mesa structure 17 illustrated in FIG. 2A. The buried layers 19 are grown between the mesa structures in the array and have substantially flat upper surfaces 19a. The buried layers 19 include side surfaces 19b and 19c extending obliquely from the vicinities of edges of the insulating mask 15 to edges of the upper surfaces 19a. The side surfaces 19b and 19c define openings 19d above the insulating mask 15. When the buried layers are grown on the principal surface of the InP substrate at which the (100) plane is exposed, the (100) plane is exposed at the upper surfaces 19a of the buried layers 19. The (111)B plane is exposed at each of the side surfaces 19b and 19c of the buried layers 19.

The buried layers 19 include buried portions 19e that cover the principal surface of the substrate and the mesa structures so as to embed the mesa structures; and ridged portions 19f that protrude from the buried portions in the direction normal to the principal surface of the substrate between the mesa structures. The ridged portions 19f include the substantially flat upper surfaces 19a; and the side surfaces 19b and 19c inclined with respect to the upper surfaces 19a. The whole of each of the ridged portions 19f is arranged above a first reference plane R1 extending along upper surfaces 17d of the mesa structures 17. A distance between the first reference plane R1 and the upper surfaces 19a of the ridged portions 19f is about 5 to about 10 μm. An effective growth rate in the vicinities of edges of the upper surfaces 17d of the mesa structures 17 is reduced by the action of the halogen-based substance during the growth of the buried layers. Thus, the buried layers are grown between the mesa structures 17. After the mesa structures 17 are embedded in the semiconductor, the growth of the semiconductor is continued to form the buried layers 19. In this buried layer growth step, a second substrate product SP2 including the buried layers 19 is formed. The buried layers 19 include openings 19d extending along the insulating masks 15 on the front side of the second substrate product SP2. The surface of the substrate and the side surfaces of the mesa structures 17 are embedded in the buried layers 19. No buried layer is grown on the upper surfaces 17d of the mesa structures 17 covered with the insulating masks 15, and the insulating masks 15 are exposed through the openings 19d. The buried layers 19 are composed of, for example, semi-insulating InP. When a semiconductor layer is epitaxially grown on a substrate, the growth rate of the semiconductor layer depends on the plane direction of a surface on which the semiconductor layer is grown. After the growth of the semiconductor layer, a specific surface of the semiconductor layer appears because of different growth rates due to different plane directions. In the step of selectively growing the buried layers in this embodiment, the buried layers are grown while a gas containing the halogen-based substance is supplied into the growth chamber in addition to the raw materials for the growth of the semiconductor. The growth rate is controlled by supplying the halogen-based gas together with the raw-material gas in such a manner that a growth rate on the (011) plane exposed at the side surfaces of the mesa is reduced, compared with a growth rate on the surface of the substrate at which the (100) place is exposed. Thus, in the epitaxial growth on the (100) plane, the buried layers are grown in such a manner that the (100) plane is exposed at the upper surfaces 19a of the buried layers 19 and the (111)B plane is exposed at the side surfaces 19b and 19c of the buried layers 19. By performing the growth of the buried layers, a highly flat surface serving as an underlying surface for the subsequent processing is provided on part of the front side of the second substrate product SP2. A process of growing the semiconductor layers to embed the mesa structures will be described in detail below with reference to FIGS. 6A to 6C, 7A and 7B, and 8A to 8C.

The upper surfaces 17d of the mesa structures 17 extend along the first reference plane. Each of the side surfaces 19b and 19c of the buried layers 19 extends along a second reference plane R2 inclined with respect to the first reference plane R1. In a preferred embodiment, the (111)B plane is exposed at each of the side surfaces 19b and 19c of the buried layers 19. The growth such that the (111)B plane is exposed at each of the side surfaces 19b and 19c of the buried layers 19 facilitates providing the flat upper surfaces 19a of the buried layers 19.

Figure 2B:
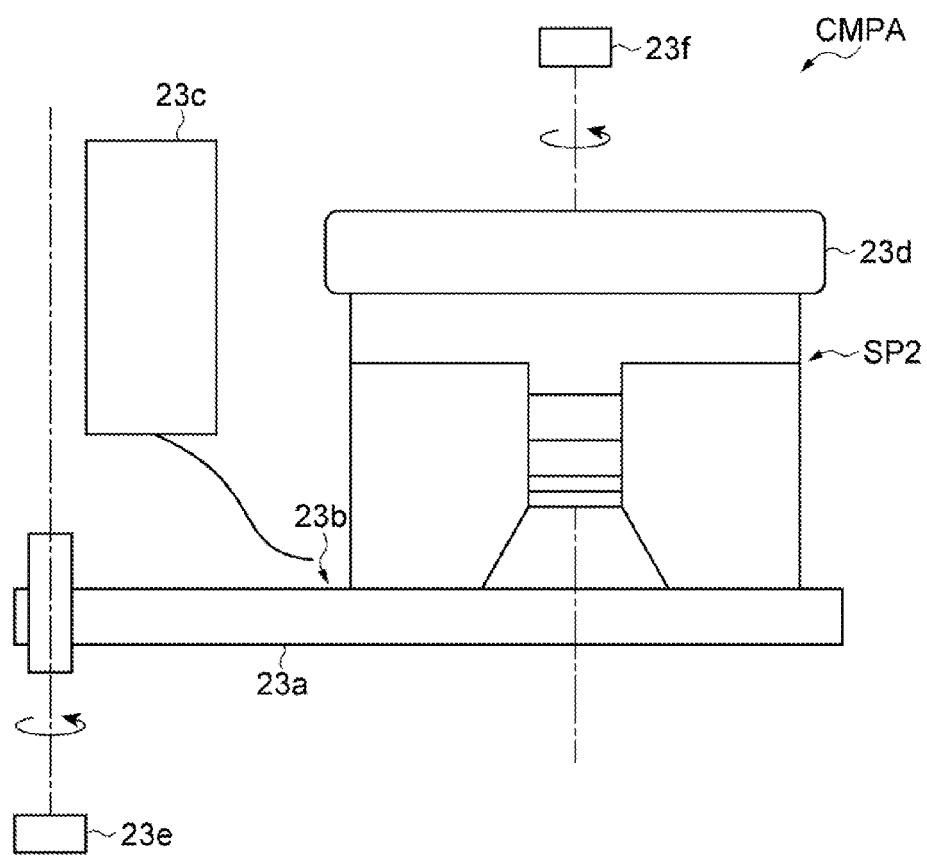

After the growth of the buried layers 19, the upper side of the second substrate product SP2 is processed while the insulating masks 15 are left without being removed, as illustrated in FIG. 2B. This processing includes a process using a chemical-mechanical polishing (CMP) method. For example, the buried layers 19 are processed by the CMP method to produce a subsequent substrate product (a third substrate product SP3 illustrated in FIG. 3A). In this processing, the buried layers 19 of the second substrate product SP2 are thinned by the CMP method. At the time of the completion of this processing, most of the ridged portions 19f are removed by the processing. In a preferred embodiment, however, the ridged portions 19f may be partially left. The remaining portions are processed by the CMP method so as to have substantially flat upper surfaces. The amount of the ridged portions 19f processed or the amount of the ridged portions 19f left is associated with the depth of focus in exposure in the subsequent step (exposure in a mask pattern formation step of forming a distributed reflector). A processing apparatus CMPA for performing chemical-mechanical polishing illustrated in FIG. 2B includes a support 23a which supports a substrate product to be processed and which is equipped with a buff; a feeder 23c to feed a polishing liquid 23b; a holder 23d to apply a load for processing; a first rotation mechanism 23e to rotate the support 23a; and a second rotation mechanism 23f to rotate the holder 23d. Upon polishing, the second substrate product SP2 is placed to the processing apparatus CMPA. The second substrate product SP2 is mounted on the support 23a. In this case, the upper side of the second substrate product SP2 is faced to the support 23a.

Examples of processing conditions
Type of buff: nonwoven fabric, urethane foam
Polishing liquid 23b: Br/methanol
Load applied by holder 23d: 80 kPa
Rotation speed of first rotation mechanism 23e: 400 rpm
Rotation speed of second rotation mechanism 23f: 800 rpm The polishing liquid contains a Br/methanol mixture (mixing ratio (by mass): $Br_2$/methanol=1/1000 to 1/10) as a main component. The processing speed is controlled by the mixing ratio in the Br/methanol mixture and the rotation speed. In the processing of the buried layers 19, the insulating masks 15 protect the upper surfaces of the mesa structures 17.

In the processing step, after a desired amount of the ridged portions 19f polished or left is achieved, the processing of the buried layers 19 is completed, resulting in the third substrate product SP3. In the following description, each buried layer 19 that has been processed into a desired state is referred to as a "buried region".

To detect the endpoint of the processing (accomplishment of the desired processing), the insulating masks 15 are used in this embodiment. The endpoint of the processing is detected in association with the height of the mesa structure. The processing apparatus CMPA detects a difference in polishing pressure between the polishing of the InP semiconductor of the ridged portions 19f and the polishing of the InP semiconductor of the ridged portions 19f and the insulating masks 15 (for example, SiN). The processing is terminated in response to the detection.

Figure 3A:
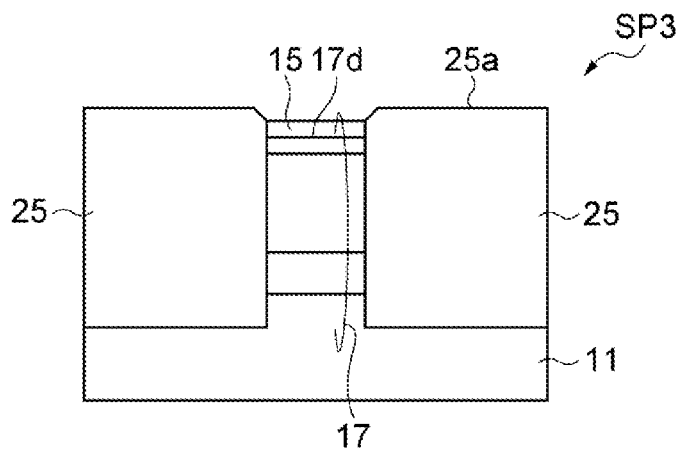
FIGS. 3A to 3C schematically illustrate main steps in a method for producing a quantum cascade laser according to an embodiment.

FIG. 2B illustrates the second substrate product SP2 during the processing. FIG. 3A illustrates the third substrate product SP3 removed from the processing apparatus CMPA after the completion of the processing. The third substrate product SP3 includes the substrate 11, the mesa structure 17, and buried regions 25. Depending on the amount left in the processing step, the buried regions 25 are higher than the upper surface 17d of the mesa structure 17 and have substantially flat upper surfaces 25a provided by the CMP method. Steps are formed at boundaries between the upper surface of the insulating mask (insulating mask 15) left after the processing step and the upper surfaces 25a of the buried regions 25. The size of the steps is 0 μm or more, depending on a request from the detection of the amount left in the planarization processing (for example, the endpoint detection with the insulating masks 15), and 5 μm or less, depending on a request from a desired amount left in the exposure. The steps extend along both edges of the upper surface 17d of the mesa structure 17. The upper surface 17d of the mesa structure 17 has a flatness accomplished by the epitaxial growth on the substrate 11. The upper surfaces 25a of the buried regions 25 have a flatness accomplishable by the CMP method.

Figure 3B:
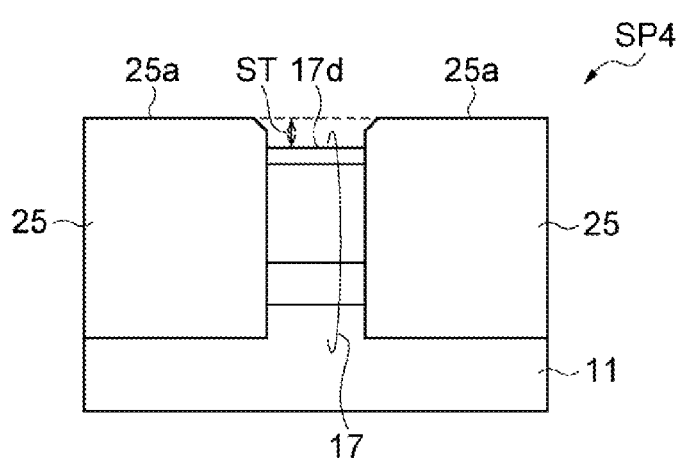

As illustrated in FIG. 3B, the insulating mask 15 is removed from the third substrate product SP3 to produce a fourth substrate product SP4. SiN is etched with, for example, buffered hydrofluoric acid. Removal of the insulating mask 15 exposes the upper surface 17d of the mesa structure 17 at a surface of the fourth substrate product SP4.

In the fourth substrate product SP4, the size of steps ST between the upper surface 17d of the mesa structure 17 and the upper surfaces 25a of the buried regions 25 is more than 0.1 µm, depending on a requirement for the amount left in planarization processing (for example, the thickness of the insulating mask 15), and 5 µm or less, depending on a request from focusing in exposure. The upper surface 17d of the mesa structure 17 is flat, except for the steps ST. The upper surfaces 25a of the buried regions 25 are also flat. The steps ST are preferably small in view of exposure in a photolithographic process.

After removal of the insulating mask 15, a mask having a pattern on the mesa structure 17 and the buried regions 25 is formed. The upper surfaces 25a of the buried regions 25 are specular surfaces and have a surface roughness Rz of 200 nm or less. The surface roughness enables exposure for the production of the distributed reflection structure.

Figure 3C:
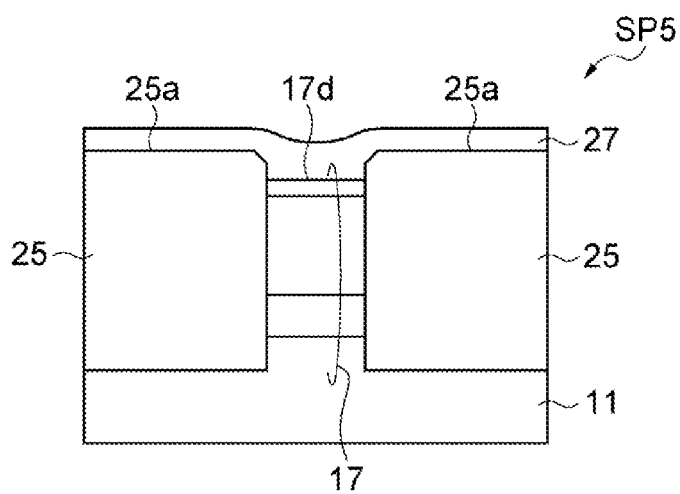

A specific procedure will be described below. As illustrated in FIG. 3C, an insulating layer 27 used for a mask configured to form a distributed reflector is formed on the fourth substrate product SP4. The insulating layer 27 is composed of, for example, a silicon-based inorganic insulating material, specifically silicon oxide ($SiO_2$), silicon oxide nitride (SiON), or silicon nitride (for example, SiN). The insulating layer 27 composed of the silicon-based inorganic insulating material is formed by, for example, a chemical vapor deposition (CVD) method. The insulating layer 27 has a thickness of, for example, 100 to 500 nm.

Figure 4A:
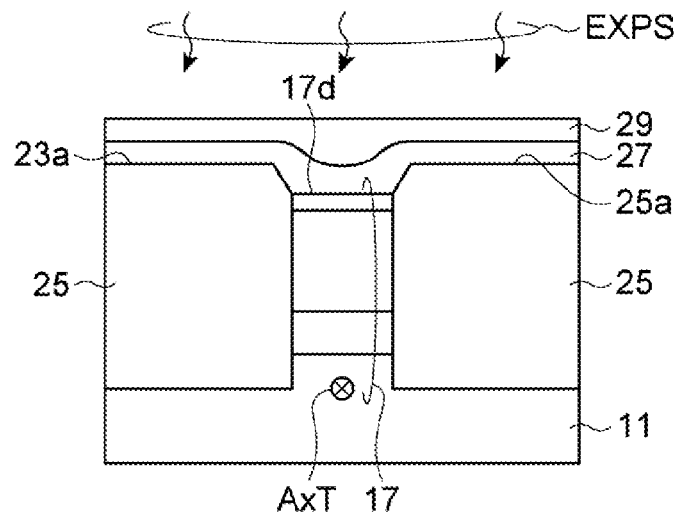
FIGS. 4A to 4C schematically illustrate main steps in a method for producing a quantum cascade laser according to an embodiment.

The application and exposure of a resist to form a mask pattern for a distributed reflector is performed. As illustrated in FIG. 4A, a resist 29 is applied on the insulating layer 27. Exposure EXPS for the transfer of the mask pattern for a distributed reflector to the resist 29 is then performed. In this embodiment, the width of the distributed reflector to be produced is larger than the mesa width of the mesa structure 17. In the embodiment, the height of the buried regions 25 is set to be substantially equal to the height of the mesa structures not by growth of the buried layers but by the processing of the buried layers 19 on the substrate surfaces between the mesa structures 17 using the CMP method. Thus, the mask pattern for a distributed reflector is accurately transferred to the resist 29 over a wider area than the mesa width of each mesa structure 17 during the exposure EXPS. In this way, a resist mask is formed. In FIG. 4A, the mesa structure 17 extends in the direction of a first axis Ax1.

Figure 4B:
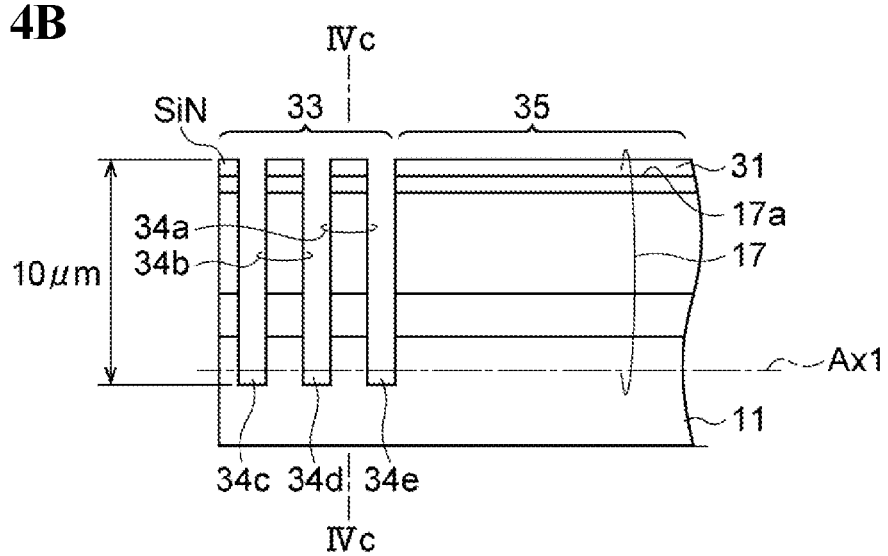

The insulating layer 27 is etched with the resist mask by using a dry etching method to form a mask 31 configured to define the form of a distributed reflector as illustrated in FIG. 4B. In the formation of the distributed reflector, semiconductor regions located below the mask 31, specifically, the buried regions 25 and the mesa structures 17 in this embodiment, are subjected to dry etching with the mask 31 to produce a distributed reflection structure 33 and a waveguide mesa 35. The distributed reflection structure 33 and the waveguide mesa 35 are arranged in the direction of the first axis Ax1. The distributed reflection structure 33 is optically coupled to the waveguide mesa 35 to form a laser cavity. The width of the distributed reflection structure 33 (width in a direction normal to the principal surface of the substrate and a direction orthogonal to the first axis Ax1) is larger than the mesa width of the mesa structure 17. A combination of a thick-film growth and processing by the CMP method results in the formation of semiconductor walls 34a and 34b each having a desired width in the distributed reflection structure 33. In this embodiment, the etching is performed to a depth that is larger than the height of the mesa structure 17 (for example, 8 µm). The etch depth (the height of the semiconductor walls of the distributed reflection structure 33) sufficient to form the distributed reflection structure 33 is, for example, 10 µm.

Figure 4C:
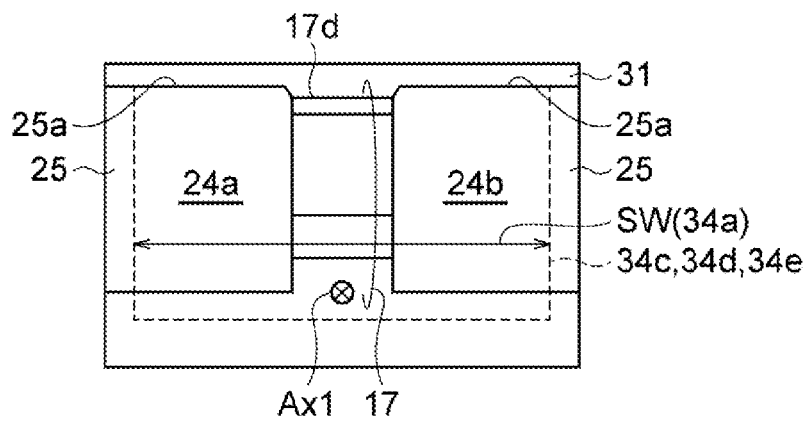

In this production method, the buried layers 19 embedding the mesa structures 17 are formed so as to have a thickness that is larger than the height of the mesa structure 17. Then, the buried layers 19 are processed by the CMP method. The processing of the buried layers 19 forms the buried regions 25 in which the mesa structure 17 is embedded. In the processing of the buried layers 19, the buried layers 19 are reduced in thickness by the polishing method without processing the mesa structure 17. After this processing, the mask 31 for the formation of the distributed reflection structure 33 is formed on the buried regions 25 and the mesa structure 17. By performing these steps, a difference between resolution on the upper surfaces 25a of the buried regions 25 and resolution on the upper surface 17d of the mesa structure 17 is reduced during the exposure EXPS for the mask formation because the steps ST between the upper surface 17d of the mesa structure 17 and the upper surfaces 25a of the buried regions 25 is set to be preferably small for exposure in a photolithographic process, as described above. Thus, the distributed reflection structure 33 is wider than the width of the mesa structure 17, as illustrated in a cross section taken along line IVc-IVc of FIG. 4B (a cross section illustrated in FIG. 4C). The distributed reflection structure 33 extends from one buried portion 24a arranged on one side of the mesa structure 17 to the other buried portion 24b arranged on the other side of the mesa structure 17 and intersects the mesa structure 17. In FIG. 4C, the width of the semiconductor walls 34a and 34b is indicated by a dashed line designated as "SW". The dashed line SW also indicates the width of the grooves 34c, 34d, and 34e. In this embodiment, both ends of each of the semiconductor walls 34a and 34b are connected to each other with the semiconductor region.

Figure 5A:
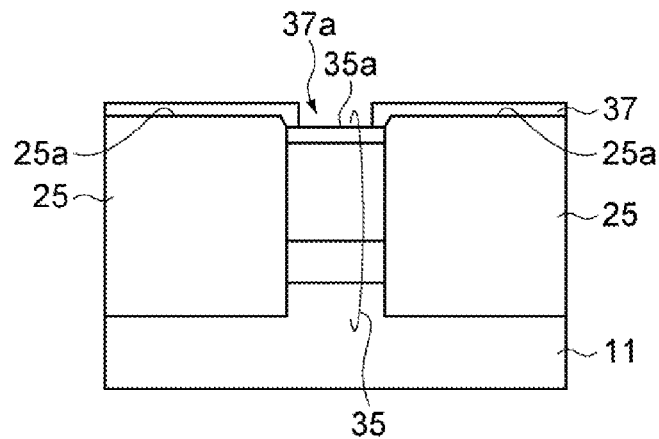
FIGS. 5A to 5C schematically illustrate main steps in a method for producing a quantum cascade laser according to an embodiment.
Figure 5B:
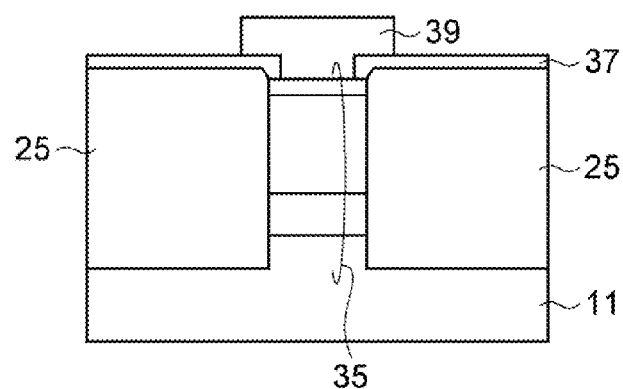
Figure 5C:
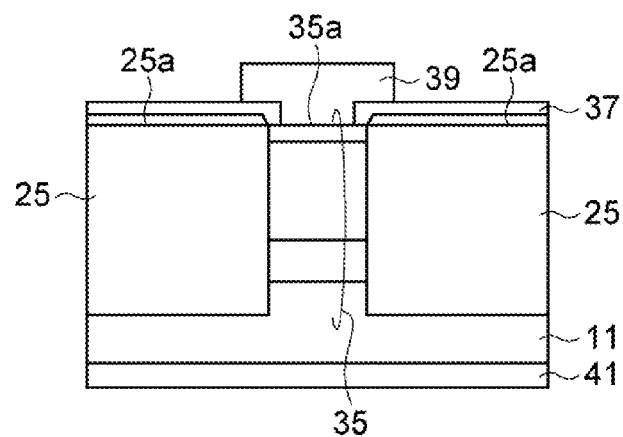

After the formation of the distributed reflection structure 33, a protective film 37 (for example, a SiON film) is formed on an upper surface 35a of the waveguide mesa 35 and the upper surfaces 25a of the buried regions 25, as illustrated in FIG. 5A. The protective film 37 includes an opening 37a located above the upper surface 35a of the waveguide mesa 35 in order to establish contact between an electrode and the semiconductor layer. After the formation of the protective film 37, a first electrode 39 is formed on the protective film 37 and the upper surface 35a of the waveguide mesa 35 through the opening 37a, as illustrated in FIG. 5B. For example, the first electrode 39 has a Ti/Pt/Au structure. If necessary, after polishing the back side of the substrate 11, a second electrode 41 is formed on the back side of the substrate 11, as illustrated in FIG. 5C. For example, the second electrode 41 has a Ti/Pt/Au structure.

A quantum cascade laser is formed through these steps.

FIGS. 6A to 6C, 7A to 7C, and 8A to 8C schematically illustrate growth processes of semiconductor layers (buried layers) on the side surface of mesa structures.

Figure 6A:
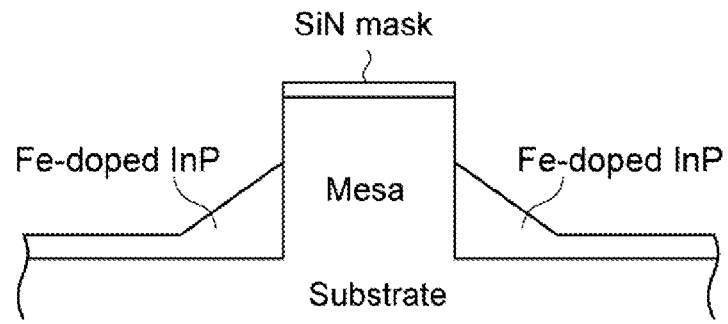
FIGS. 6A to 6C schematically illustrate a growth process of a semiconductor layer where a mesa structure is buried.
Figure 6B:
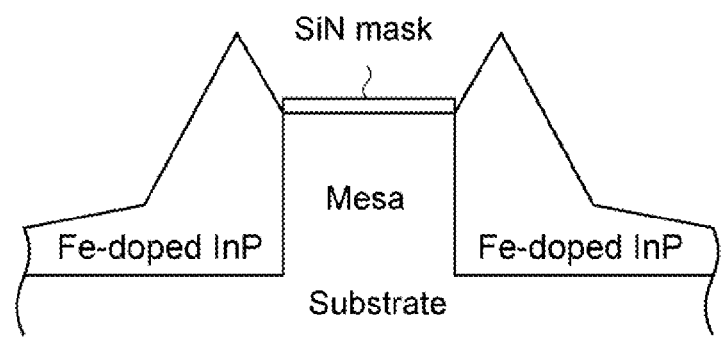
Figure 6C:
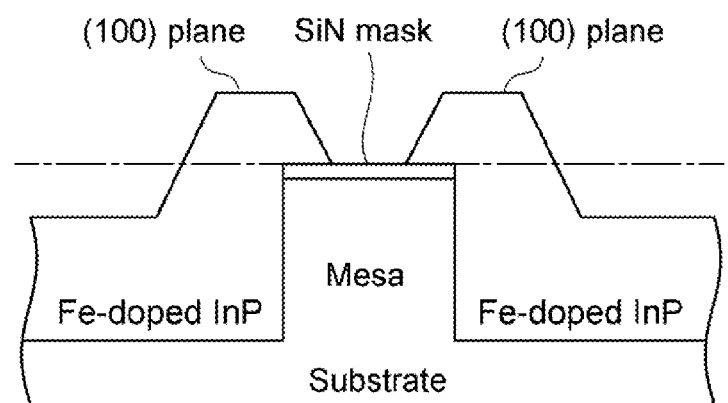

FIGS. 6A to 6C illustrate three stages of growth when substantially no effect of a halogen-based substance such as HCl is provided (for example, growth when only a small amount of the halogen-based substance such as HCl is supplied). When no halogen-based substance is supplied, the same tendency as above is indicated. FIG. 6A illustrates the growth of Fe-doped InP in the early stage of the growth. In this stage, growth at side surfaces of a mesa predominates. FIG. 6B illustrates the growth of Fe-doped InP in the middle stage of the growth. In this stage, growth at upper edge portions of the mesa is significantly observed. FIG. 6C illustrates the growth of Fe-doped InP in a stage in which the (100) plane of InP appears (final stage of the growth). In this stage, semiconductor regions overlap a SiN mask on the mesa and have ridged portions at the upper edge portions of the mesa, the ridged portions being higher than the upper surface of the mesa. The (100) plane is exposed at the ridged portions. The semiconductor regions in areas between the mesas have an upper surface lower than the upper surfaces of the mesas.

Figure 7A:
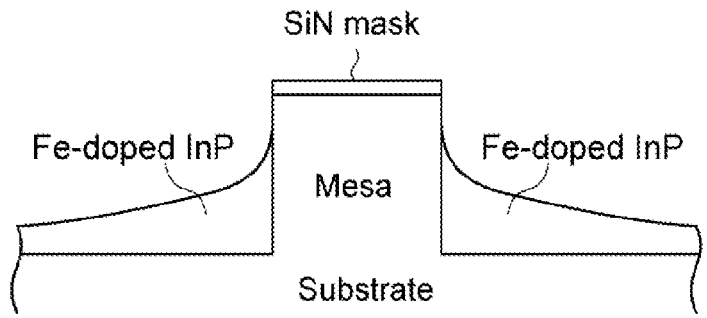
FIGS. 7A to 7C schematically illustrate a growth process of a semiconductor layer where a mesa structure is buried.
Figure 7B:
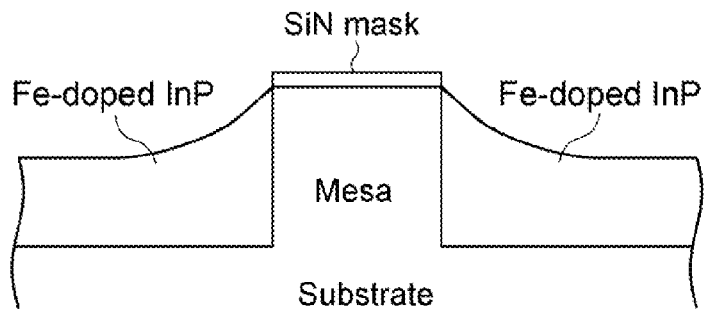
Figure 7C:
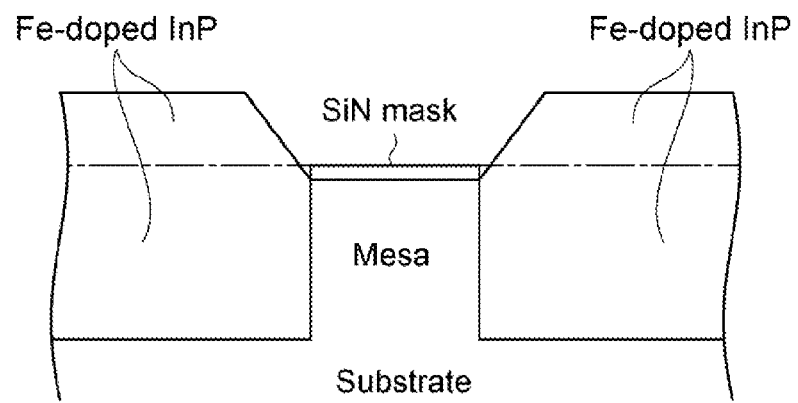

FIGS. 7A to 7C illustrate three stages of growth when the supply amount of the halogen-based substance such as HCl and the growth temperature are set to suitable conditions. FIG. 7A illustrates the growth of Fe-doped InP in the early stage of the growth. In this stage, growth on a substrate surface predominates over growth on side surfaces of a mesa. FIG. 7B illustrates the growth of Fe-doped InP in the middle stage of the growth. In this stage, large anomalous growth is not observed at upper edge portions of the mesa. FIG. 7C illustrates the growth of Fe-doped InP in a stage in which the (100) plane of InP appears (final stage of the growth). In this stage, substantially no overlap is present between semiconductor regions and a SiN mask on the mesa. The semiconductor regions have ridged portions, the ridged portions being higher than the upper surface of the mesa in all areas between the mesas as well as at the upper edge portions of the mesa. The InP(100) plane is exposed at the ridged portions. The InP(111)B plane is exposed at side surfaces of the ridged portions. Upper surfaces of the semiconductor regions in areas between the mesas are flat. Buried layers are grown in the areas between the mesas.

Figure 8A:
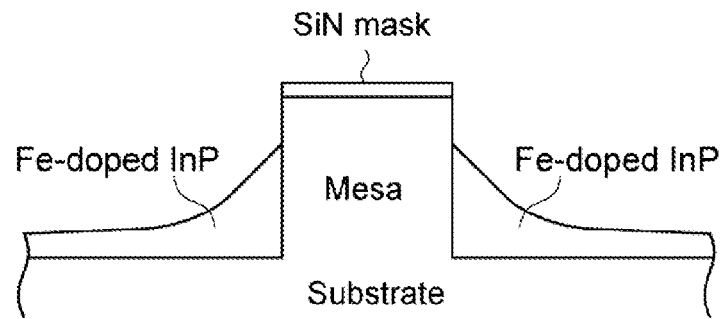
FIGS. 8A to 8C schematically illustrate a growth process of a semiconductor layer where a mesa structure is buried.
Figure 8B:
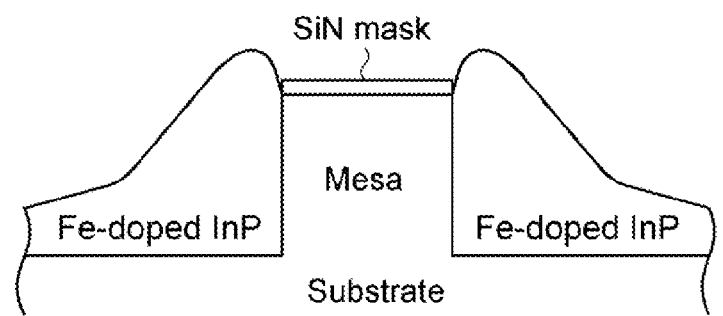
Figure 8C:
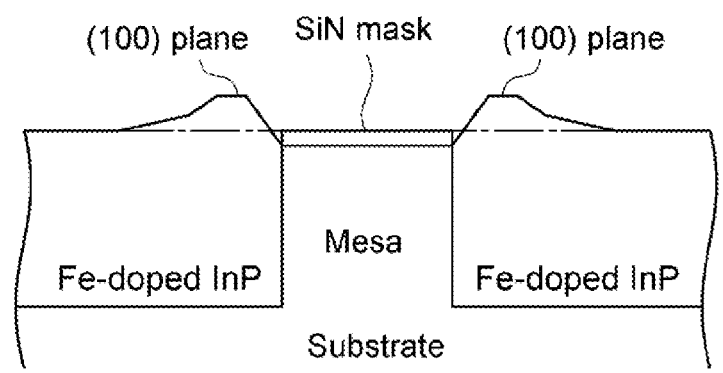

FIGS. 8A to 8C illustrate three stages of growth in the case where the supply amount of the halogen-based substance such as HCl is suitable and where the growth temperature is lower than a suitable temperature. FIG. 8A illustrates the growth of Fe-doped InP in the early stage of the growth. In this stage, growth on side surfaces of a mesa predominates slightly over growth on a substrate surface. FIG. 8B illustrates the growth of Fe-doped InP in the middle stage of the growth. In this stage, different growth rates are observed at different distances from upper edge portions of the mesa because the growth on the side surfaces of the mesa predominates. FIG. 8C illustrates the growth of Fe-doped InP in a stage in which the (100) plane of InP appears (final stage of the growth). As with FIG. 7C, substantially no overlap is present between semiconductor regions and a SiN mask on the mesa. Upper surfaces of the semiconductor regions are undulated in areas between the mesas. The undulated portions of the buried layers preferably have an undulation of, for example, 5 μm or less. The semiconductor regions have ridged portions that are higher than the upper surface of the mesa over the entire surface as well as upper edge portions of the mesa. The InP(100) plane is exposed at part of the ridged portions. The InP(111)B plane is exposed at side surfaces of the ridged portions.

Figure 9:
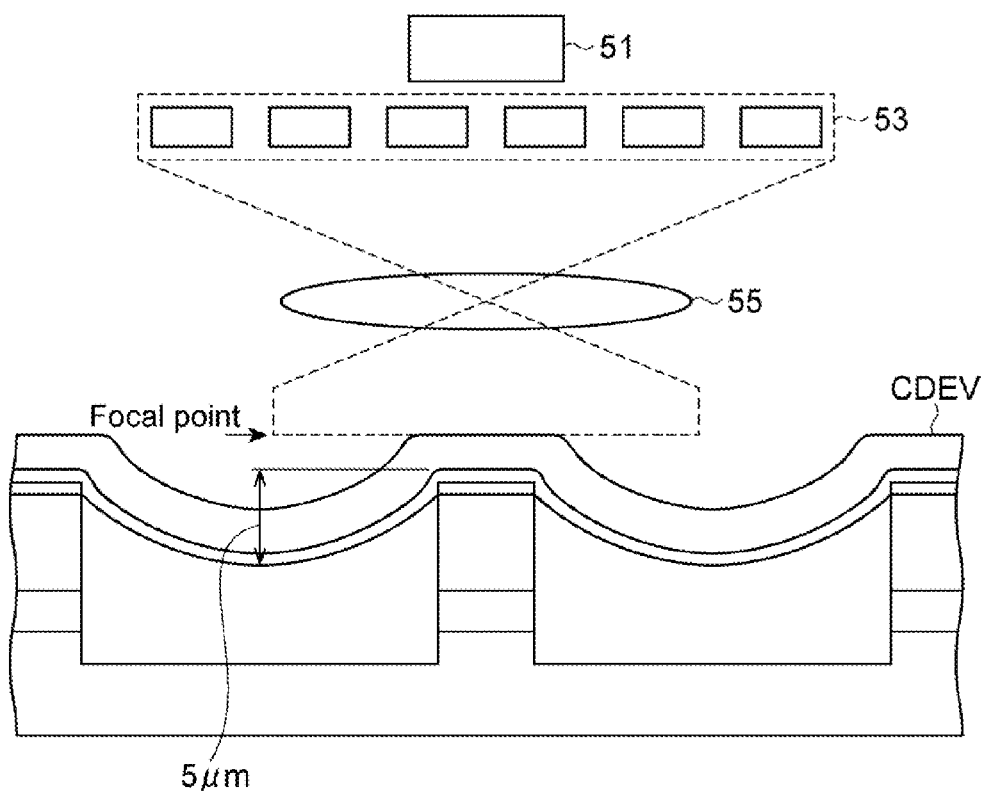
FIG. 9 illustrates a semiconductor product CDEV having a structure in which mesa structures are buried by selective growth of buried layers.

FIG. 9 illustrates a semiconductor product CDEV having mesa structures embedded by buried layers grown by selective growth. When semiconductor regions are grown on surface portions of a substrate between the mesa structures so as to have a height equal to the height of the mesa structures, semiconductor layers are grown from side surfaces of the mesa structures and the surface portions of the substrate in the vicinities of the mesa structures. In portions remote from the mesa structures, no semiconductor layer is grown from the side surfaces of the mesa structures, and the semiconductor layers are grown from the surface portions of the substrate. The thickness of the buried semiconductor regions selectively grown between two neighboring mesa structures decreases with increasing distance from one of the mesa structures and increases with decreasing distance from the other mesa structure because of the foregoing different growth mechanisms. The semiconductor regions have recesses with a depth of about 5 μm on surfaces thereof and thus are not flat.

Figure 10:
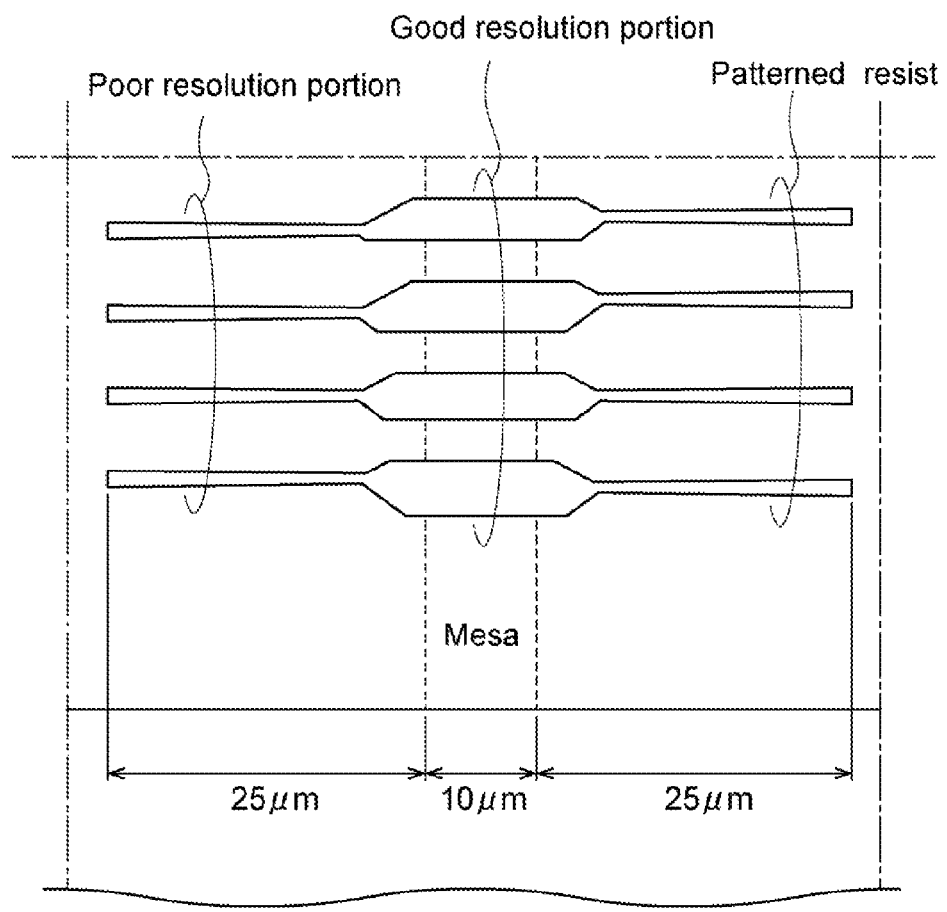
FIG. 10 illustrates the resolution of a resist on the semiconductor product CDEV.

As illustrated in FIG. 9, a distance between the upper surfaces of the mesa structures and bottoms of the recesses in the semiconductor regions in which the mesa structures are embedded is 5 μm or more because of the selective growth of the buried layers. In exposure for the formation of a pattern used for a distributed reflection structure, the semiconductor product CDEV is placed in an exposure apparatus. Light emitted from a light source 51 passes through a reticle 53 and is focused on the upper surface of the mesa structure of the semiconductor product CDEV through a lens 55. The recesses (with a depth of about 5 μm) in the semiconductor regions cause a reduction in resolution outside the upper surface of the mesa structure. A pattern on the reticle 53 is not resolved in a resist outside the upper surface of the mesa structure because of deficient exposure. FIG. 10 illustrates the resolution of the resist on the semiconductor product CDEV. In a mask pattern for the distributed reflection structure, the width of openings used to etch the semiconductor is decreased, or the openings are not formed on the upper surface of the mesa. A quantum cascade laser emits laser light having an infrared or mid-infrared wavelength. Thus, light emitted from an end facet of a waveguide mesa diverges laterally at an angle of about 45°. The distributed reflection structure requires wide semiconductor walls in order to receive the diverging light. The distributed reflection structure preferably includes three or more semiconductor walls. The distributed reflection structure including three semiconductor walls has a length of about 20 μm. Each of the semiconductor walls has a width of about 25 μm on one side. However, it is difficult to form a mask for the formation of the wide semiconductor walls because of the recesses (with a depth of about 5 μm) in the semiconductor regions in which the mesa structure is embedded.

Figure 11:
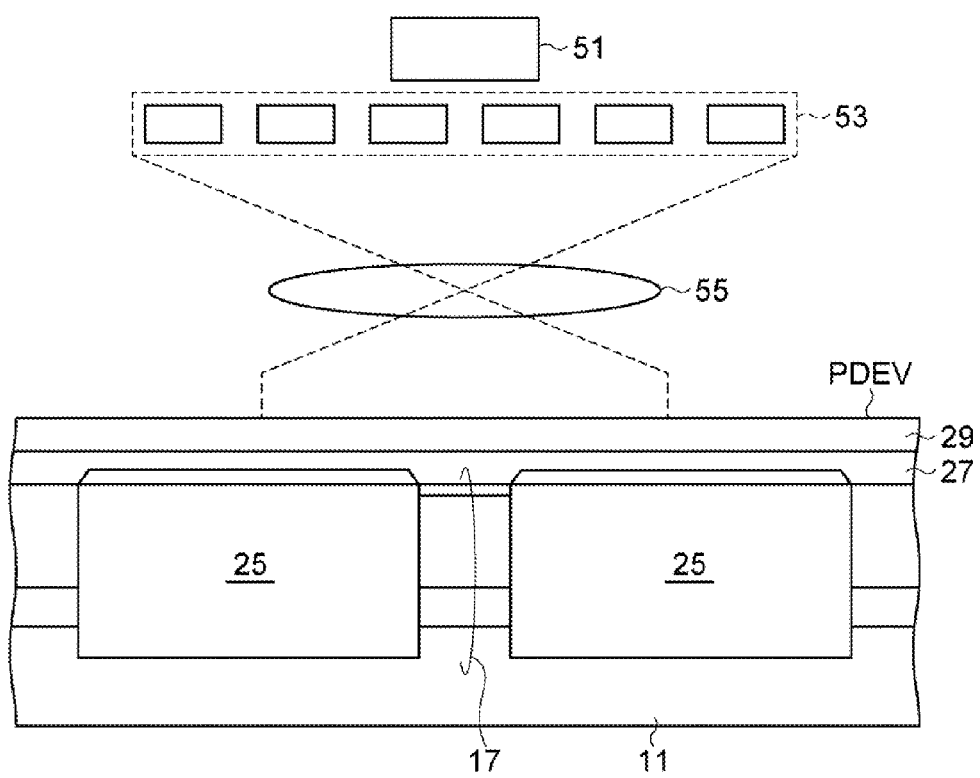
FIG. 11 illustrates a semiconductor product PDEV having a device structure according to an embodiment.
Figure 12:
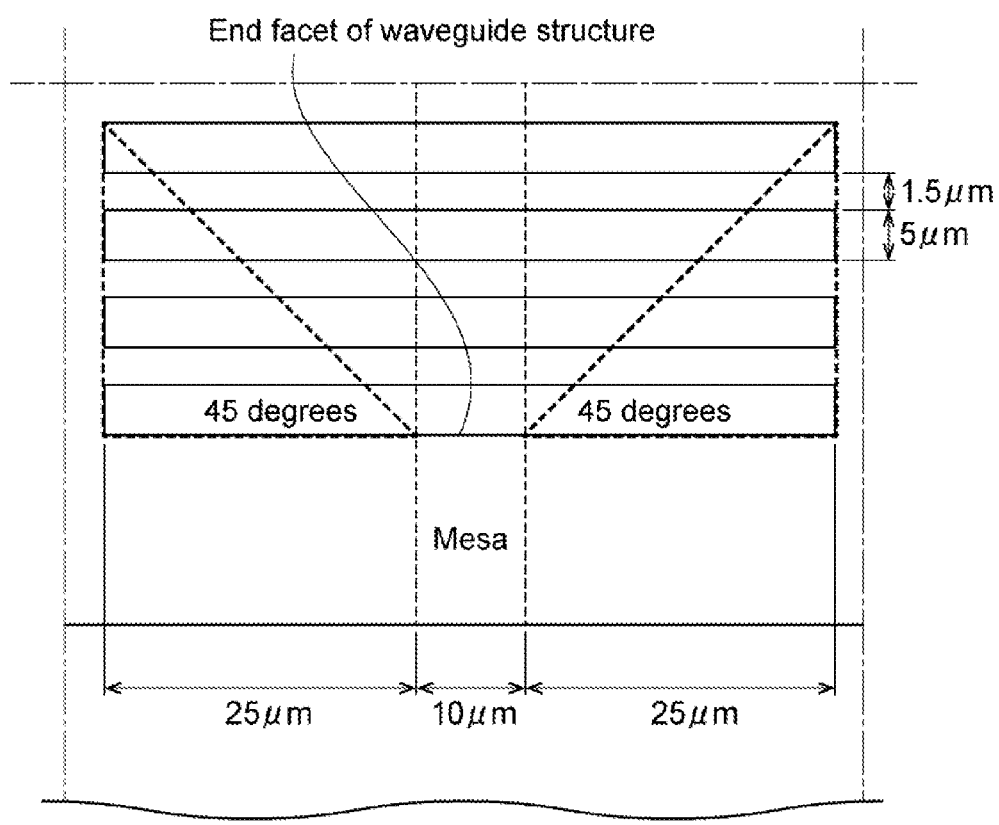
FIG. 12 illustrates the resolution of a resist on the semiconductor product PDEV.

FIG. 11 illustrates a semiconductor product PDEV having a device structure according to an embodiment (a structure produced by a combination of ridged portions of the buried layers 19 and processing using a CMP method). FIG. 12 illustrates the resolution of a resist on the semiconductor product PDEV. As is understood from the description of the embodiments, a difference in height between the upper surface of a mesa structure and upper surfaces of semiconductor regions in which the mesa structure is embedded is small enough to obtain acceptable resolution because of the planarization of a ridged structure. As is illustrated in FIG. 11, in exposure for the formation of a pattern used for a distributed reflection structure, the semiconductor product PDEV is placed in an exposure apparatus. For the semiconductor product PDEV, light emitted from the light source 51 passes through the reticle 53 and is then focused on the upper surface of the mesa structures 17 and on the upper surfaces of the buried regions 25 of the semiconductor product PDEV through the lens 55. Thus, the pattern on the reticle 53 is resolved over the entire wafer. Regarding the pattern for the distributed reflection structure, an appropriate width of openings is obtained on any of the upper surface of the mesa structure 17 and the upper surfaces of the buried regions 25, as illustrated in FIG. 12. Uniformity in the width of each of the openings is directly correlated with uniformity in the thickness of the distributed reflection structure (thickness of semiconductor walls). A quantum cascade laser emits laser light having an infrared or mid-infrared wavelength. Thus, light emitted from an end facet of a waveguide mesa diverges laterally at an angle of about 45°. The distributed reflection structure requires wide semiconductor walls in order to receive the diverging light. In the distributed reflection structure including three semiconductor walls, as has already been described, each of the semiconductor walls has a width of about 25 μm on one side. In the semiconductor product PDEV, it is possible to form the semiconductor walls having a desired width that is larger than the width of the mesa.

Figure 13:
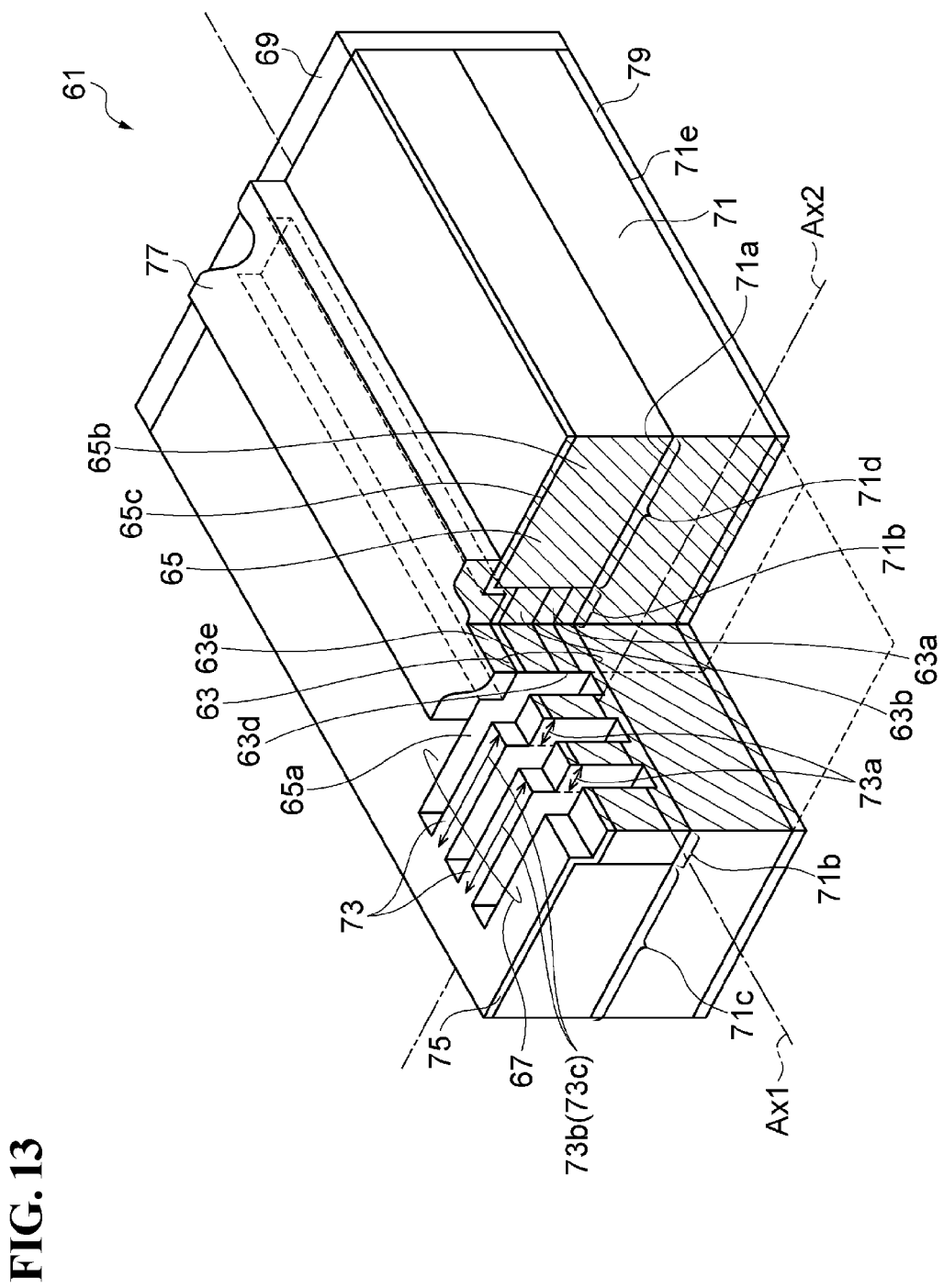
FIG. 13 is a perspective view schematically illustrating a quantum cascade laser according to an embodiment.

FIG. 13 is a perspective view schematically illustrating a quantum cascade laser according to an embodiment. A quantum cascade laser 61 includes a waveguide structure 63, buried regions 65, and a distributed reflection structure 67. The waveguide structure 63 is provided on a first area 71b of a principal surface 71a of a substrate 71. The waveguide structure 63 includes a core layer 63a and a cladding layer 63b. The buried regions 65 are provided on a second area 71c and a third area 71d of the principal surface 71a of the substrate 71, and the waveguide structure 63 is embedded by the buried regions 65. The distributed reflection structure 67 has a greater width than the waveguide structure 63 and is optically coupled to an end facet 63d of the waveguide structure 63. The waveguide structure 63 extends in a direction of the first axis Ax1. The distributed reflection structure 67 includes one or more semiconductor walls 73 extending in a direction of a second axis Ax2 that intersects the first axis Ax1. Each of the semiconductor walls 73 includes a first portion 73a located on the first area 71b, a second portion 73b located on the second area 71c, and a third portion 73c located on the third area 71d. The second portion 73b, the first portion 73a, and the third portion 73c are arranged in that order in the direction of the second axis Ax2. The upper surface of the second portion 73b and the upper surface of the third portion 73c are higher than the upper surface of the first portion 73a. In this embodiment, the first portion 73a has a stacked structure corresponding to the waveguide structure 63. Each of the second portion 73b and the third portion 73c has a structure corresponding to the buried regions 65.

In the quantum cascade laser 61, light propagating through the waveguide structure 63 is emitted from the end facet 63d of the waveguide structure 63 and diverges horizontally and vertically. The distributed reflection structure 67 includes one or more semiconductor walls 73. In each of the semiconductor walls 73, the upper surface of the second portion 73b and the upper surface of the third portion 73c are higher than the upper surface of the first portion 73a. In the quantum cascade laser 61, the height of the second and third portions 73b and 73c of each semiconductor wall 73 of the distributed reflection structure 67 is greater than the height of the first portion 73a of the corresponding semiconductor wall 73. With respect to a length of the corresponding semiconductor wall 73 in the direction of the first axis Ax1 (specifically, the thickness of the semiconductor wall), the width of each of the semiconductor walls 73 is desirably uniform in the direction of the second axis Ax2 because of this structure. The reflectance of the distributed reflection structure 67 is controlled to a desired accuracy owing to the high uniformity of the thickness. A reflectivity of the distributed reflection structure 67 is improved because of the structure in which the height of the second and third portions 73b and 73c of each semiconductor wall 73 of the distributed reflection structure 67 is greater than the height of the first portion 73a of the corresponding semiconductor wall 73.

The quantum cascade laser 61 has a reflection structure 69 located on an opposite side of the distributed reflection structure 67. The reflection structure 69 may include a reflection film formed of a dielectric film but is not limited thereto. The distributed reflection structure 67, the waveguide structure 63, and the reflection structure 69 are arranged in the direction of the first axis Ax1 to form a laser cavity.

The quantum cascade laser 61 further includes a passivation film 75 arranged on the waveguide structure 63 and the buried regions 65, a first electrode 77 in contact with the upper surface of the waveguide structure 63, and a second electrode 79 in contact with the back side 71e of the substrate 71.

Each of the semiconductor walls 73 has a length of 25 to 100 μm in the direction of the second axis Ax2. Each of the second and third portions 73b and 73c of each of the semiconductor walls 73 has a length of 25 μm or more in the direction of the second axis Ax2. The distributed reflection structure 67 has the structure in which the height of the second and third portions 73b and 73c of each of the semiconductor walls 73 is greater than the height of the first portion 73a of the corresponding semiconductor wall 73. This structure results in the quantum cascade laser 61 including the semiconductor walls 73 having a width corresponding to the divergence of light in the direction of the second axis Ax2.

The buried regions 65 include one buried portion 65a arranged on the second area 71c and the other buried portion 65b arranged on the third area 71d. An upper surface 65d of the buried portion 65b (buried portion 65a) is higher than an upper surface 63e of the waveguide structure 63.

Having described and illustrated the principle of the invention in a preferred embodiment thereof, it is appreciated by those having skill in the art that the invention can be modified in arrangement and detail without departing from such principles. The present invention is not restricted to the specific configurations disclosed in the embodiments. We therefore claim all modifications and variations coming within the spirit and scope of the following claims.

What is claimed is:

1. A method for producing a quantum cascade laser, comprising the steps of:
    growing a stacked semiconductor layer on a principal surface of a substrate, the stacked semiconductor layer including a core layer;
    forming an insulating mask on the stacked semiconductor layer;
    forming a mesa structure including the core layer on the principal surface of the substrate by etching the stacked semiconductor layer through the insulating mask;
    growing a buried layer on a side surface of the mesa structure using the insulating mask as a selective mask by supplying a halogen-based substance and a gas containing a raw material into a growth chamber, the buried layer having a thickness larger than a height of the mesa structure;
    producing a substrate product including the mesa structure and a buried region by processing of the buried layer using a chemical-mechanical polishing method;
    after removal of the insulating mask, forming a mask on the mesa structure and the buried region of the substrate product; and
    producing a distributed reflection structure by etching the mesa structure and the buried region of the substrate product using the mask.

2. The method according to claim 1, wherein, in the step of producing the substrate product, the processing of the buried layer includes a step of detecting an endpoint of the processing using the insulating mask.

3. The method according to claim 1,
wherein the buried layer is made of InP, and
the buried layer has a (100) plane that is exposed at an upper surface of the buried layer.

4. The method according to claim 1,
wherein the mesa structure has an upper layer extending along a first reference plane,
the buried layer includes a side surface extending along a second reference plane inclined with respect to the first reference plane, and
the side surface of the buried layer includes a (111)B plane.

5. The method according to claim 1, wherein, in the step of producing the substrate product, the processing of the buried layer is performed by using a polishing liquid that contains a Br/methanol mixture.

\* \* \* \* \*